(12) United States Patent
Yamamoto et al.

(10) Patent No.: US 7,786,005 B2
(45) Date of Patent: Aug. 31, 2010

(54) METHOD FOR MANUFACTURING SEMICONDUCTOR DEVICE TO FORM A VIA HOLE

(75) Inventors: Kenichi Yamamoto, Kanagawa (JP); Masashige Moritoki, Kanagawa (JP); Takashi Shimane, Kanagawa (JP); Kazumi Saito, Kanagawa (JP); Hiroaki Tomimori, Kanagawa (JP); Takamasa Itou, Kanagawa (JP); Kousei Ushijima, Kumamoto (JP); Katsuro Tateyama, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 240 days.

(21) Appl. No.: 11/369,955

(22) Filed: Mar. 8, 2006

(65) Prior Publication Data

US 2006/0214300 A1 Sep. 28, 2006

(30) Foreign Application Priority Data

Mar. 25, 2005 (JP) .............................. 2005-090213

(51) Int. Cl.
*H01L 21/467* (2006.01)
(52) U.S. Cl. ...................... 438/637; 438/751; 438/627; 438/653; 257/E21.246
(58) Field of Classification Search ................. 438/637, 438/622, 648, 751, 792, 682, 798, E21.577
See application file for complete search history.

(56) References Cited

U.S. PATENT DOCUMENTS 5,176,790 A * 1/1993 Arleo et al. .................. 438/715

| | | | | |
|---|---|---|---|---|
| 5,589,041 | A | * | 12/1996 | Lantsman ............... 204/192.33 |
| 5,811,358 | A | * | 9/1998 | Tseng et al. ................. 438/725 |
| 5,976,973 | A | * | 11/1999 | Ohira et al. ................. 438/645 |
| 6,412,498 | B1 | * | 7/2002 | Shields ........................ 134/1.2 |
| 6,903,026 | B2 | * | 6/2005 | Han ............................ 438/710 |
| 2003/0181031 | A1 | * | 9/2003 | Kojima et al. ............... 438/627 |
| 2004/0141278 | A1 | * | 7/2004 | Grosse et al. ............... 361/213 |
| 2004/0259374 | A1 | * | 12/2004 | Yasuda ........................ 438/751 |
| 2007/0275558 | A1 | * | 11/2007 | Ushijima ..................... 438/648 |

FOREIGN PATENT DOCUMENTS

| | | |
|---|---|---|
| JP | 08-213366 | 8/1996 |
| JP | 2003-282571 | 10/2003 |
| JP | 2003-332313 | 11/2003 |
| JP | 2005-033182 | 2/2005 |

OTHER PUBLICATIONS

Japanese Patent Office issued a Japanese Office Action dated Oct. 20, 2009, Application No. 2005-090213.

* cited by examiner

*Primary Examiner*—Marcos D. Pizarro
*Assistant Examiner*—Eva Yan Montalvo
(74) *Attorney, Agent, or Firm*—Young & Thompson

(57) ABSTRACT

An increase of the via resistance resulted due to the presence of the altered layer that has been formed and grown after the formation of the via hole can be effectively prevented, thereby providing an improved reliability of the semiconductor device. A method includes: forming a TiN film on the semiconductor substrate; forming an interlayer insulating film on a surface of the TiN film; forming a resist film on a surface of the interlayer insulating film; etching the semiconductor substrate having the resist film formed thereon to form an opening, thereby partially exposing the TiN film; plasma-processing the exposed portion of the TiN film to remove an altered layer formed in the exposed portion of the TiN film; and stripping the resist film via a high temperature-plasma processing.

16 Claims, 8 Drawing Sheets

RESISTANCE

RESISTANCE

METHOD FOR MANUFACTURING SEMICONDUCTOR DEVICE TO FORM A VIA HOLE

This application is based on Japanese patent application No. 2005-90,213, the content of which is incorporated hereinto by reference.

BACKGROUND

1. Technical Field

The present invention relates to a method for manufacturing a semiconductor device, and particularly relates to a method for manufacturing a semiconductor device having an interconnect structure that includes a titanium nitride (TiN) film provided on interconnects.

2. Related Art

In recent years, under the circumstances of an enhanced integration and an enhanced processing rate for a semiconductor device, reductions in an interconnect resistance and/or an interconnect capacitance are required. In addition, in a semiconductor device having a multiple-layered interconnect structure, aluminum, copper or the like are employed for an interconnect material, and in this case, a barrier metal layer is provided for the purpose of preventing these metals from diffusing into the insulating film.

Japanese Patent Laid-Open No. 2003-282,571 discloses a technology, in which an interlayer insulating film is formed on a surface of a metal nitride film that will be utilized as a barrier metal layer during the formation of via holes for providing electric couplings to interconnects in a semiconductor device, and then a reactive ion etching (RIE) process is conducted through a predetermined patterned mask to form the via holes, thereby partially exposing the metal nitride film that forms bottoms of the vias, and after stripping the patterned mask, a processing with a plasma of a gas containing nitrogen is carried out.

In Japanese Patent Laid-Open No. H08-213,366, an etching technology related to a removal of a side film in a process for forming multiple-layered interconnects for creating a via hole is disclosed.

Meanwhile, an altered layer composed of deposits of fluorocarbon films, oxides of the exposed portion of such metal nitride films or the like may be often formed on the surface of the metal nitride film of the via bottom.

If such altered layer is formed on the exposed portion of the metal nitride film on the via bottom, a via formed by filling the via hole with, for example, tungsten may exhibit an increased electric resistance (via resistance) when the via is energized, thereby causing a problem of deteriorating a reliability of the semiconductor device.

SUMMARY OF THE INVENTION

According to one aspect of the present invention, there is provided a method for manufacturing a semiconductor device, comprising: forming a TiN film over the semiconductor substrate; forming an interlayer insulating film on a surface of the TiN film; forming a resist film on a surface of the interlayer insulating film; etching said interlayer insulating film using said resist film as a mask to form an opening, thereby partially exposing the TiN film; plasma-processing the exposed portion of the TiN film to remove an altered layer formed in the exposed portion of the TiN film; and stripping the resist film via a plasma processing high temperature.

According to the above-described aspect of the present invention, the TiN film is formed on the surface of the interconnect or the like over semiconductor substrate in the operation of forming the TiN film, and then, the interlayer insulating film is formed on the surface of the TiN film in the operation of forming the interlayer insulating film, and further, the resist film having a predetermined pattern transferred thereon is formed on the surface of the interlayer insulating film the operation of forming the resist film. In the operation of etching the semiconductor substrate, the interlayer insulating film is etched through a mask of the resist film to partially expose the TiN film. In such exposed portion of the TiN film, an altered layer may be formed by an oxidizing reaction or the like, and then may be grown.

Subsequently, the exposed portion of the TiN film is plasma-processed to remove the altered layer in the operation of plasma-processing the exposed portion of the TiN film, and then, the resist film that has been utilized for the mask in the etching process is stripped in the operation of stripping the resist film via the high temperature-plasma processing.

Having such procedure, the altered layer can be actively removed via the plasma-processing after forming the via hole by the etching process and before stripping by the high-temperature plasma processing, and thus the formation and the growth of the altered layer can be effectively prevented even if the processing operation of stripping the resist film by the high temperature plasma processing is conducted.

According to the present invention, an increase of the via resistance resulted due to the presence of the altered layer that has been formed and grown after the formation of the via hole can be effectively prevented, thereby providing an improved reliability of the semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments concerning methods for manufacturing semiconductor devices according to the present invention will be described as follows in further detail, in reference to the annexed figures. In all figures, identical numeral is assigned to an element commonly appeared in the figures, and the detailed description thereof will not be presented.

First Embodiment

FIGS. 1A to 1C and FIGS. 2A to 2C are cross-sectional views of a semiconductor device, illustrating a process for manufacturing the semiconductor device according to first embodiment. In FIGS. 1A to 1C and FIGS. 2A to 2C, an exemplary implementation of forming a via in a semiconductor substrate having an interconnect 16 that is an interlayer interconnect formed therein is shown.

Figure 1A:
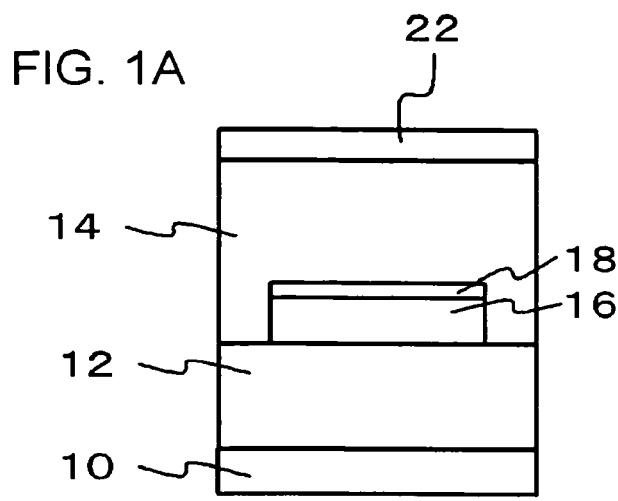
FIGS. 1A to 1C are cross sectional views, illustrating a process for manufacturing a semiconductor device according to first embodiment.
Figure 1B:
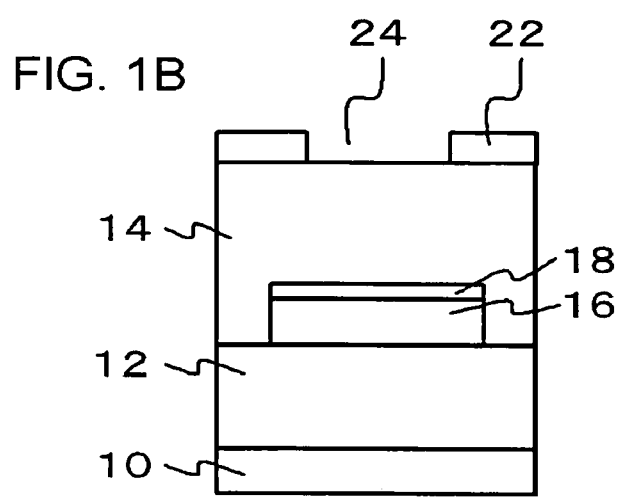
Figure 1C:
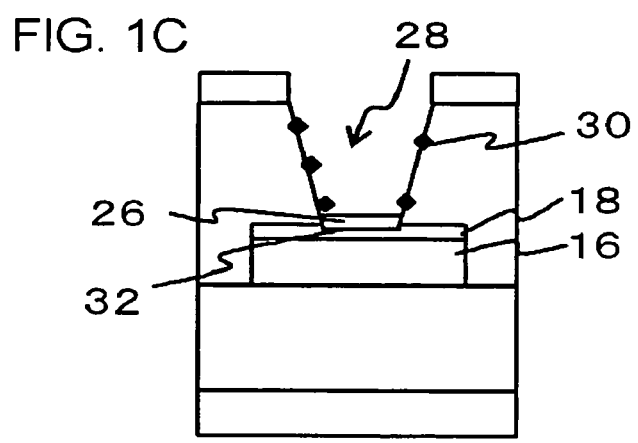
Figure 2A:
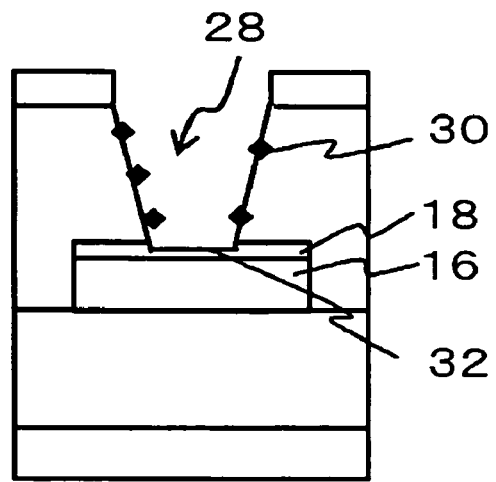
FIGS. 2A to 2C are cross sectional views, illustrating a process for manufacturing a semiconductor device according to first embodiment.
Figure 2B:
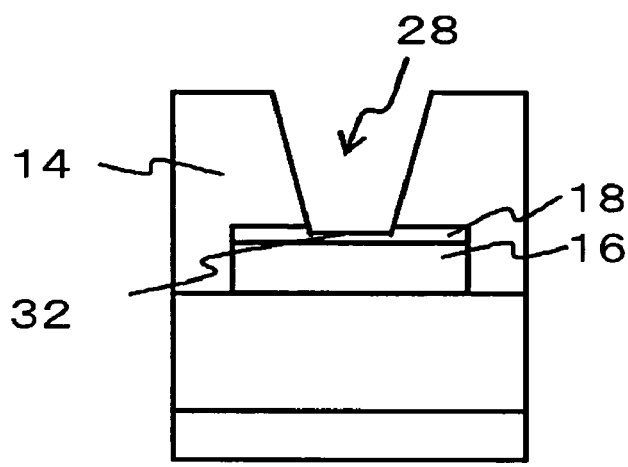

A process for manufacturing the semiconductor device according to the present embodiment includes: an operation of forming a TiN film, which involves forming a TiN film 18 over a semiconductor substrate; an operation of forming an insulating film, which involves forming an interlayer insulating film 14 on a surface of the TiN film 18; an operation of forming a resist film, which involves forming a resist film 22 on a surface of the interlayer insulating film 14 (FIG. 1A for these operations); an operation of etching, which involves etching the semiconductor substrate having the resist film 22 formed thereon to form an opening 28, thereby partially exposing the TiN film 18 (FIGS. 1B and 1C); an operation of conducting a plasma-processing, which involves plasma-processing the exposed portion of the TiN film 18 to remove an altered layer 26 that has been formed in the exposed portion 32 of the TiN film (FIG. 1C to FIG. 2A); and an operation of plasma-stripping at high temperature, which involves plasma-processing the resist film 22 at high temperature to remove thereof (FIGS. 2A and 2B).

As shown in FIG. 1A, an interlayer insulating film 12 is formed on a surface of a substrate 10, and an interconnect metal layer containing a major constituent of, for example, copper (Cu), aluminum (Al) or the like is formed over the surface of the interlayer insulating film 12 through a TiN layer therebetween, and then, a TiN layer is formed thereon (operation of forming TiN film). In addition to above, a device (not shown) is previously formed on the substrate 10. Subsequently, a predetermined patterning process and a predetermined etching process are carried out to form the interconnect 16 and further form the TiN layer 18 over the surface of the interconnect 16, and then, the interlayer insulating film 14 is formed so as to cover the interconnect 16 and the TiN layer 18 (operation of forming insulating film). Further, the resist is formed on the surface of the interlayer insulating film 14 (operation of forming resist film). Although it is not shown here, the interconnect 16 includes a barrier metal layer for inhibiting a diffusion of an interconnect material into the interlayer insulating film 12.

Subsequently, as shown in FIG. 1B, a process for patterning the resist 22 is conducted to form an opening region 24. Sequentially, a plasma etching process for the interlayer insulating film 14 is conducted under conditions generally utilized in an ordinary dry etching process through a mask of the patterned resist 22 that is remained after the patterning process, and more specifically the plasma etching process is conducted under conditions of, for example, employing a parallel-plate plasma etcher at around an ambient temperature with an organic fluoride that is generally utilized in an ordinary dry etching and by applying a power of a level that is generally utilized in an ordinary dry etching to both of an upper electrode and a lower electrode of the parallel-plate plasma etcher (operation of etching). This etching process is designed to be stopped when an intended portion of the titanium nitride (TiN) is exposed.

In this case, a deposit 30 is formed on an inside wall of the opening 28, and an altered layer 26 containing carbon (C), fluorine (F), titanium (Ti) and oxygen (O) is formed on the exposed portion 32 of the TiN film 18 that functions as the via bottom. Typical deposits 30 includes residues, reaction products or the like.

Subsequently, a plasma-processing is conducted under a predetermined condition to remove the altered layer 26, thereby partially exposing the TiN film 18 to form an exposed portion 32 of the TiN film 18, as shown in FIG. 2A (operation of plasma-processing).

Here, the "predetermined condition" in this case is a condition, which does not cause a removal of the resist 22. Specifically, the predetermined condition here is a condition for conducting a physical sputter etching that promotes etching only the altered layer 26. More specifically, the etching process is conducted at a temperature, at which oxygen is not induced in an activated state, and further specifically at an ambient temperature of, for example, equal to or lower than 30 degree C. within a gas that contains no organic fluoride, more specifically in a presence of, for example, Ar (Ar), nitrogen ($N_2$), ammonia ($NH_3$) or the like. Further, the gas may contain oxygen. While oxygen is highly activated to form oxygen radical by being processed at higher temperature, oxygen does not behave as a highly active radical at a lower ambient temperature of equal to or lower than 30 degree C., even if a plasma-processing of oxygen is previously conducted, and therefore the resist 22 is not stripped under such condition.

Further, an applying electric power employed in the plasma-processing is generally lower than an applied power utilized in the etching, and more specifically, when a parallel-plate plasma etcher, for example, is employed, an applying electric power to an upper electrode is arbitrarily selected while an applying electric power to a lower electrode may be selected to be lower than 500 W, for example.

Thus, since an unwanted oxidization of the exposed portion 32 of the TiN film 18 may be potentially progressed after the etching operation, the etching process and the plasma-processing may be conducted within the same chamber, where the etching process and the plasma-processing is conducted in series without opening the system to an atmospheric air, so that the growth of the altered layer 26 after the etching process can be inhibited and the altered layer 26 can more effectively be removed in the plasma-processing.

After the plasma-processing process has been conducted to remove the altered layer 26, the plasma-stripping process is conducted at higher temperature. In this case, oxygen gas is introduced into a chamber to conduct a plasma processing at a substrate temperature of, for example, 200 degree C. or higher for not shorter than 30 seconds. Further, higher electric power than that employed in the ordinary plasma-processing process may be utilized, or more specifically, in the case of employing a parallel-plate plasma etcher, for example, an arbitrary electric power is applied to an upper electrode, and an electric power of, for example, equal to or higher than 500 W is applied to the lower electrode.

As such, reactivity of excited oxygen radical is increased by conducting the plasma stripping process at higher temperature, resulting in the excited plasma striking the resist, and according to circumstances, striking the deposits 30 that have been adhered onto the interior wall of the opening 28, and thus the resist and the deposits are stripped, as shown in FIG. 2B.

Figure 2C:
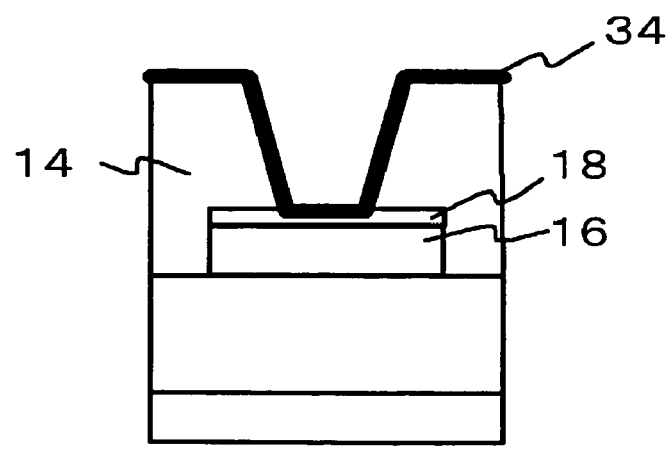
Figure 3A:
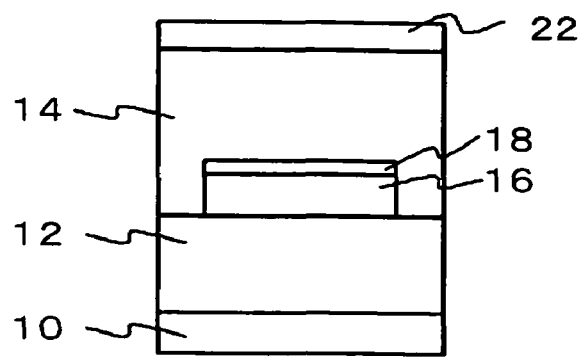
FIGS. 3A to 3D are cross sectional views, illustrating a process for manufacturing a semiconductor device according to second embodiment.
Figure 3B:
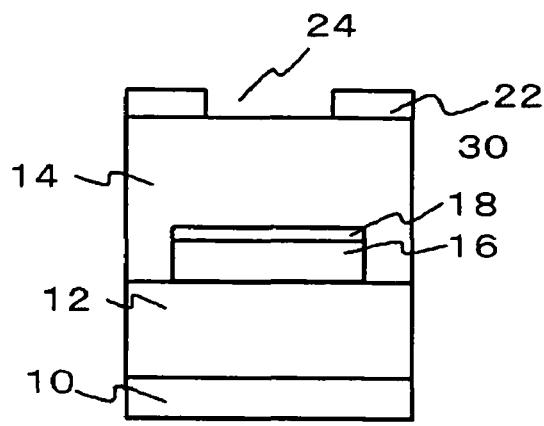
Figure 3C:
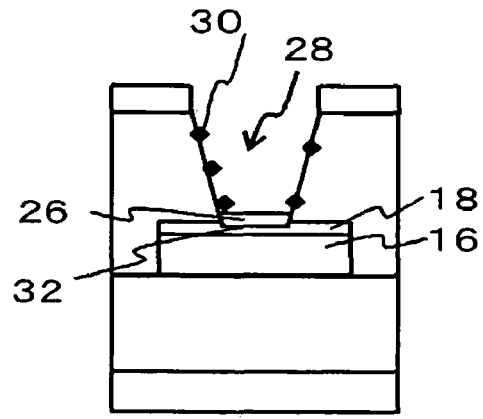
Figure 3D:
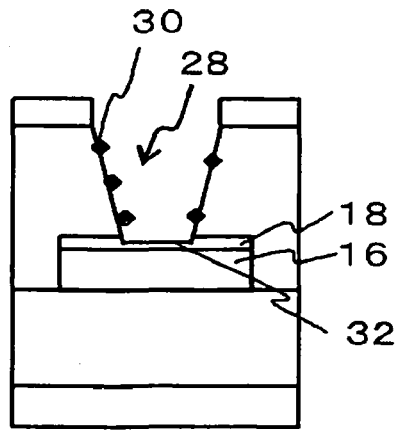

After forming the via hole in such way, a TiN film 34 is formed by depositing titanium nitride or the like in such via as shown in FIG. 2C, and then, the process is transferred to a phase of forming vias, in which vias are formed.

In the present embodiment, a plasma-processing is conducted right after conducting the etching process for the purpose of forming the via hole to effectively remove the altered layer 26 that has been formed in the exposed portion 32 of TiN film 18 over the bottom of the via, resulting in allowing a reduction of the resistance, which otherwise would be increased due to a presence of such altered layer, thereby providing an improved reliability of the semiconductor device.

Second Embodiment

FIGS. 3A to 3D and FIGS. 4A to 4C are cross-sectional views of a semiconductor device, illustrating a process for manufacturing the semiconductor device according to second embodiment. In FIGS. 3A to 3D and FIGS. 4A to 4C, an exemplary implementation of forming a via on a semiconductor substrate having an interconnect 16 that is an interlayer interconnect formed therein is illustrated, similarly as illustrated in reference to FIGS. 1A to 1C and FIGS. 2A to 2C.

A process for manufacturing the semiconductor device according to the present embodiment includes: an operation of forming a TiN film, which involves forming a TiN film 18 is over a semiconductor substrate; an operation of forming an insulating film, which involves forming an interlayer insulating film 14 on a surface of the TiN film 18; an operation of forming a resist film, which involves forming a resist film 22 on a surface of the interlayer insulating film 14 (FIG. 3A for these operations); an operation of etching, which involves forming an opening 28 in the semiconductor substrate having a resist film 22 formed thereon via an etching process to expose a portion of the TiN film 18 (FIGS. 3B and 3C); an operation of conducting a plasma-processing, which involves plasma-processing the exposed portion of the TiN film 18 to remove an altered layer 26 that has been formed in the exposed portion 32 of the TiN film (FIG. 3C and FIG. 3D); and an operation of plasma-stripping at high temperature, which involves plasma-processing the resist film 22 at high temperature to remove thereof (FIGS. 3D to 4A).

In the operations illustrated in reference to FIGS. 3A to 3D, similarly as in first embodiment (FIGS. 1A to 1C and FIG. 2A), the TiN film 18 functioning as the barrier metal layer is formed on the surface of the interconnect 16 that has been formed in the semiconductor substrate, and further the interlayer insulating film 14 is formed, and then an etching process is conducted through a mask of the resist 22 that has been formed over the surface of the interlayer insulating film 14 and patterned, and after the above-described plasma-processing is conducted to remove the altered layer 26 from the surface of the exposed portion 32 of the TiN film 18, the plasma-stripping process at high temperature is conducted to strip the resist 22.

Figure 4A:
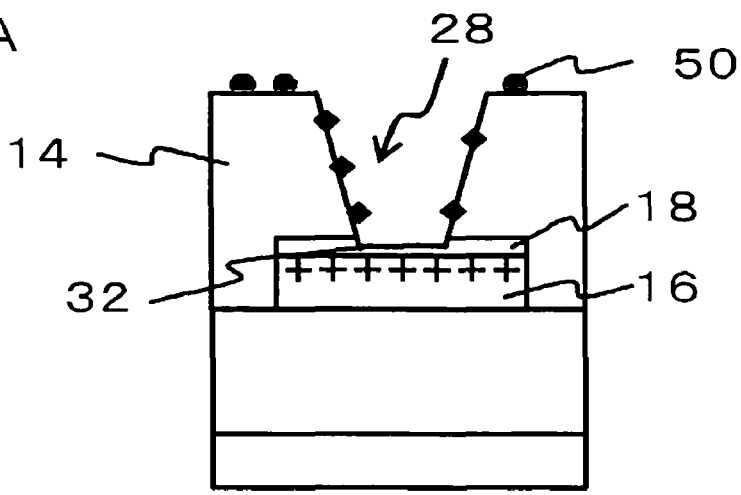
FIGS. 4A to 4C are cross sectional views, illustrating a process for manufacturing a semiconductor device according to second embodiment.

In this case, as shown in FIG. 4A, positive charge generated during the formation of the via hole tends to be remained in the entire interconnect including the exposed portion 32 of the TiN film 18 of the interconnect 16. If such condition is left for longer term without providing an additional treatment for changing the situation, an altered layer may be potentially formed and grown again on the exposed portion 32 of the TiN film 18 as have been described above.

Consequently, an ultra-violet ray processing is conducted to expose the device to an ultra-violet ray emitted from a predetermined ultra-violet light source through the exposed portion 32 of the TiN film 18, so that electric charge can be eliminated from the interconnect 16, which has been susceptible to be positively charged after the etching process (FIGS. 4A to 4B), thereby inhibiting the formation and the growth of the altered layer in this stage.

Figure 4B:
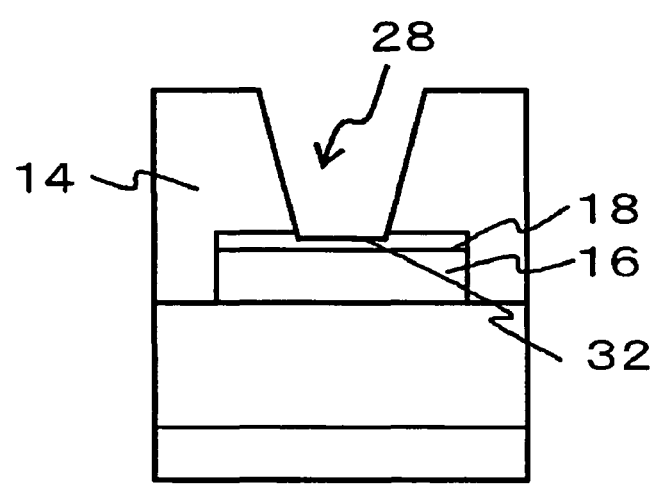

Further, after completing the ultra-violet processing, a stripping process with an organic solvent is conducted by employing an organic solvent having an ordinary level of polarity to remove deposits 30 and 50, which are composed of excess organic compounds and adhered on the inside walls of the via holes disposed in the resist residues and on the surface of the interlayer insulating film 14 exposed by the stripping of the resist 22, and according to circumstances, on the exposed portion 32 of the TiN film 18 (FIG. 4B).

Although the stripping process with the organic solvent may be allowed to be conducted in the last part of the manufacturing process in first embodiment, the implementation of the stripping process with the organic solvent for the portion where electric charge is accumulated may adversely induce a formation and a growth of the altered layer, and therefore it is preferable to conduct the stripping process with the organic solvent after eliminating electric charge from the positively charged interconnects, like the present embodiment.

Figure 4C:
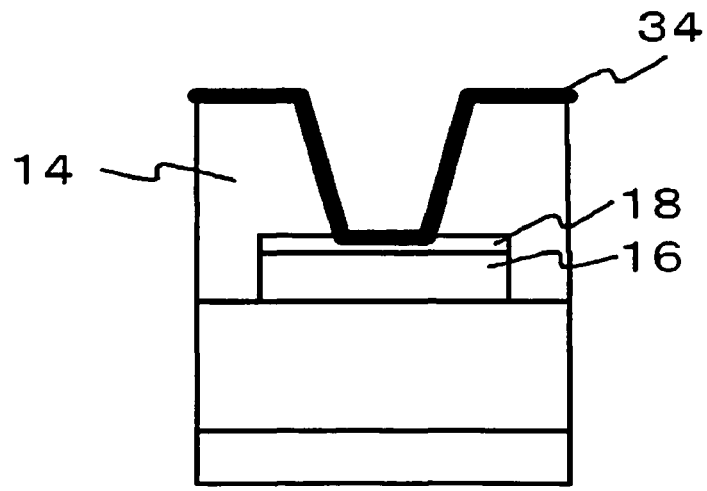

After forming the via hole in such way, a TiN film 34 is formed by depositing titanium nitride or the like over such via as shown in FIG. 4C, and then, the process is transferred to a phase of forming vias, in which vias are formed.

In the present embodiment, a plasma-processing is conducted right after conducting the etching process for forming the via hole to effectively remove the altered layer 26 that has been formed in and on the exposed portion 32 of TiN film 18 that functions as the bottom of the via. Further, an ultra-violet ray processing is conducted after stripping the resist 22 via the high temperature-plasma stripping process to eliminate electric charge from the positively charged interconnect 16, so that further formation and growth of the altered layer can be prevented. Accordingly, the resistance, which otherwise would be increased due to a presence of such altered layer, can be further effectively reduced, thereby providing a further improved reliability of the semiconductor device.

Even in a case of requiring a certain interval time after the high temperature-plasma stripping process, the implementation of the ultra-violet processing after the high temperature-plasma stripping process allows stopping the formation and the growth of the altered layer for a certain time interval after the plasma stripping process until the formation of the TiN film 34, thereby facilitating a process time control in the process for manufacturing the semiconductor device.

By contrast to the configuration according to the present embodiment, the conventional process described in Japanese Patent Laid-Open No. 2003-282,571 attempts a reduction of a via resistance by nitriding deposed films or oxidized metal nitrides that are equivalent to the altered layer, after conducting the stripping process for the resist subsequent to the formation of the via hole. However, it has been confirmed by the present inventors that, even if the above-described conventional procedure is conducted, a defective situation of providing an increased via resistance was often caused according to a base layout and/or an interconnect pattern. It is considered that this is because the growth of the altered layer formed on the via bottom is progressed, during the resist stripping by the high temperature-plasma processing conducted subsequent to the etching process for forming the via hole, and therefore the altered layer can not be sufficiently nitridated even if the nitridation process is conducted after fully growing the altered layer.

In another typical conventional process described in Japanese Patent Laid-Open No. H08-213,366, after the etching process for forming the via hole, a dry etch process with a fluoride compound and a wet etch process are conducted for removing a side film adhered onto an interior wall of the via hole, and thereafter, an ashing process is conducted with ozone gas to strip the resist film. Although this procedure provides the removal of the side film, the disclosure of Japanese Patent Laid-Open No. H08-213,366 provides no information on the altered layer disposed on the via bottom, which is a target to be removed by the present embodiment, and therefore an advantageous effect obtainable by employing the configuration of the present embodiment as described above cannot be expected.

Since a certain plasma-processing is conducted after the etching for forming the via hole to remove the altered layer formed on the via bottom in the present embodiment, the problem of the unwanted growth of the altered layer formed on the via bottom, which are not solved by the technology disclosed in Japanese Patent Laid-Open No. H08-213,366 or by the technology disclosed in Japanese Patent Laid-Open No. H08-213,366, can be effectively inhibited, thereby preventing an increase of the via resistance.

While the preferred embodiments of the present invention have been described above in reference to the annexed figures, it should be understood that the disclosures above are presented for the purpose of illustrating the present invention only, and various configurations other than the above described configurations can also be adopted.

EXAMPLES

Examples of the present invention will be described as follows. It is needless to note that the scope and the spirit of the present invention are not intended to be limited to the disclosures of these examples.

Example 1

According to first embodiment of the present invention, subsequent to the etching for forming the via hole, a plasma-processing was conducted with a parallel-plate plasma etcher that is identical to one employed in the previous process, at a room temperature of equal to or lower than 30 degree C., by applying an electric power of 1,000 W to the upper electrode and applying an electric power of 100 W to the lower electrode, and under conditions that are equivalent to the condition for conducting milder sputter etching than the previously conducted dry etching for forming the via hole. Thereafter, an electric power of 600 to 1,400 W was applied at a temperature of 200 degree C. or higher in a presence of oxygen gas to conduct a high temperature-plasma stripping process, thereby stripping the resist.

Figure 5:
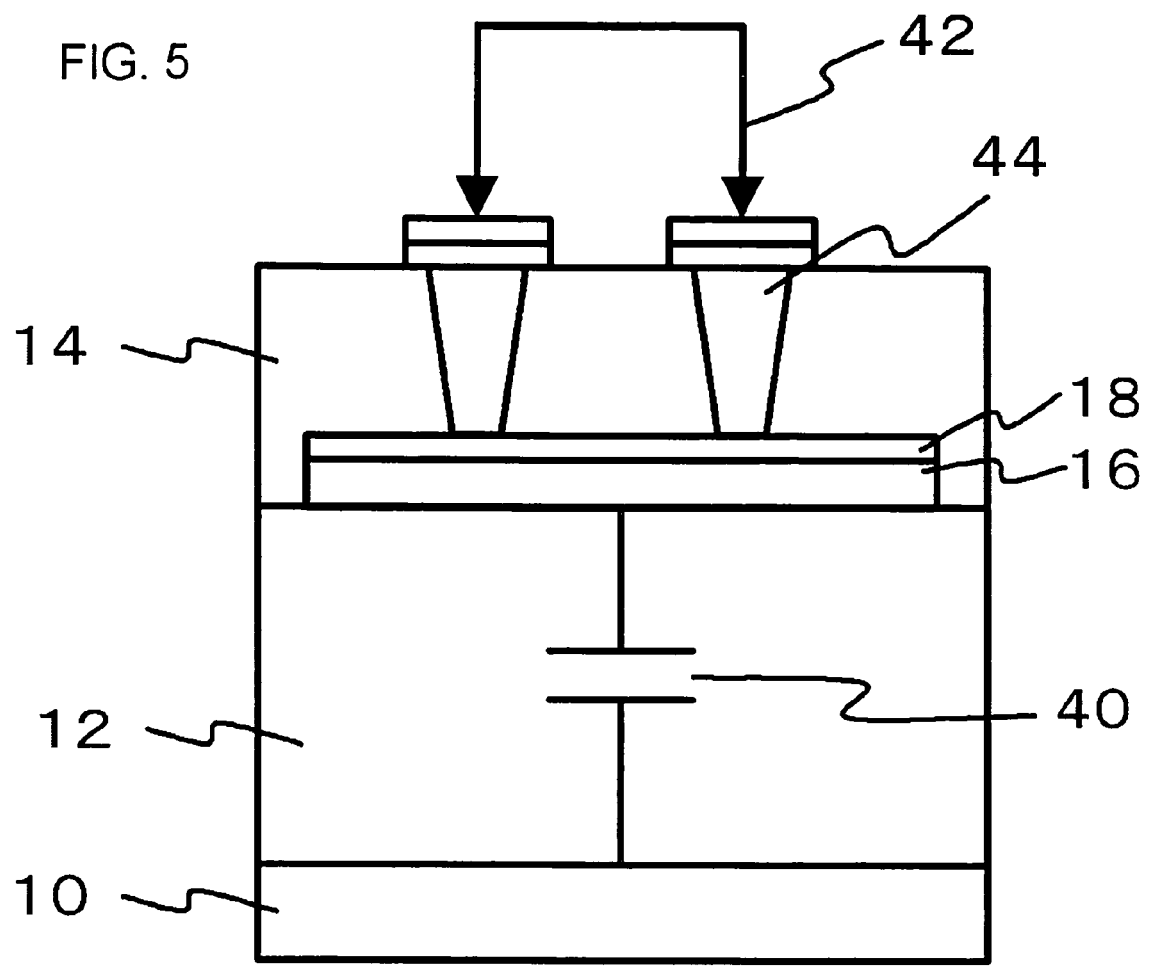
FIG. 5 is a cross sectional view, illustrating a procedure for determining a via resistance employed in an example.
Figure 6A:
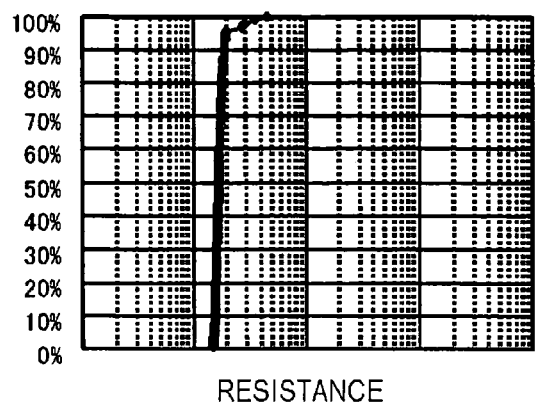
FIGS. 6A and 6B are graphs, showing an advantageous effect of a plasma-processing after the etching for forming the via hole.

It has been confirmed by the present inventors that, in the semiconductor device, the via resistance is increased when the via is coupled to the electric charge-accumulated interconnect. Consequently, as shown in FIG. 5, a formation of the via plugs 44 composed of tungsten or the like was sequentially conducted, and an interconnect pad was further formed on the upper surface thereof to form an interconnect pattern test elementary group (TEG) for measuring the via resistance. Here, electric charge accumulated in the interconnect is schematically expressed as an electric charge accumulation area 40 under the interconnect 16 in FIG. 5. Such interconnect pattern TEG was employed to measure via resistances by pointing the interconnect pad with a measurement probe 42 of a prober (resistance measurement apparatus) at one hundred points over a surface of a wafer. Plots of the results of the via resistances obtained by applying a certain voltage is shown in FIG. 6A as presented by cumulative frequency.

Example 2

Similar procedure as employed in example 1 was conducted except that the stripping of the resist by the high temperature-plasma stripping process was conducted without conducting the plasma-processing after the etching process for forming the via hole, and the via resistance was measured by pointing with the measurement probe 42 after forming the via plug, similarly as in example 1 as shown in FIG. 5. Results are shown in FIG. 6B.

Figure 6B:
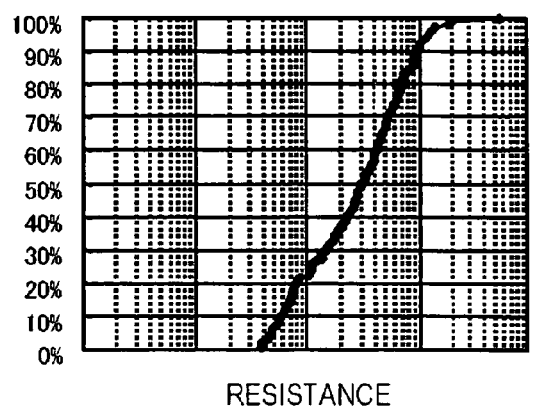

As can be seen from FIG. 6B, uneven distribution of the resistances were found in the wafer surface according to the results of example 2, suggesting that portions of higher resistance were included. On the other hand, as can be seen from FIG. 6A, a peak frequency of points is presented at a certain lower value of resistance in example 1, suggesting that substantially no deviation is included in the via resistance distribution. These results teaches that the implementation of the operation for removing the altered layer that has been formed on the exposed portion 32 of the TiN film 18 right after the etching process for forming the via hole promotes the advantageous effect of reducing the via resistance. Cross sections of the exposed portion 32 of the TiN film 18 right after completing the etching process for forming the via hole and was compared with the cross section right after the plasma-processing after the etching by the observation via a transmission electron microscope (TEM), though the photos are not presented, and it was confirmed that the altered layer, which was found to be formed right after the etching process for forming the via hole, was removed by the later plasma-processing.

Example 3

Similar procedure as employed in example 1 was conducted, and additionally, the via resistances were measured by pointing the interconnect pads of respective interconnect pattern TEG with the measurement probe as shown in FIG. 5, after forming a plurality of interconnect pattern TEG having different electric charge accumulation areas, and a value of a critical capacitance for obtaining 90% of a production yield of vias was calculated. Results are shown in table 1.

Example 4

Similar procedure as employed in example 1 was conducted, except that, after the etching process for forming the via hole, a plasma-processing was conducted to remove the altered layer after storing thereof within an atmospheric air for 24 hours, and the via resistances were measured by pointing the interconnect pads of respective interconnect pattern TEG with the measurement probe similarly as in example 1 as shown in FIG. 5, and then a value of a critical capacitance for obtaining 90% of a production yield of a via was calculated. Results are shown in table 1.

Table-1

TABLE 1

| | EXAMPLE 3 | EXAMPLE 4 |
|---|---|---|
| CRITICAL CAPACITANCE FOR OBTAINING 90% OF PRODUCTION YIELD OF VIAS (pF) | 68.02 | 43.01 |

Here, it has been already found by the present inventors that larger capacitance value in the electric charge accumulation area that is coupled to the via, or more specifically greater accumulation of electric charge in portions of the semiconductor devices that are coupled to interconnects, provides larger deviation in the distribution of the via resistances on the wafer surface and larger increase of the resistance.

The production yield of the via means a ratio of products having a predetermined reference value of the via resistance, which is lower than the value that corresponds to the value of the good-quality commercial product, when the measurements of the via resistance are conducted at 100 points over the wafer surface. In example 4, the capacitance of the electric charge accumulation area was 43.01 pF, and the production yield of the via was 90%. By additionally considering the facts confirmed in the above-described examples, it is meant that a production yield is below 90% for a via coupled to an electric charge accumulation area of larger capacitance than the above indicated value. Thus, it was found that the implementation of the plasma-processing successively after the etching process for forming the via hole without exposing the system to the atmospheric air is more effective in improving the reliability related to the via resistance.

Example 5

Similar procedure as employed in example 1 was conducted except that different temperatures were employed for the plasma stripping process to conduct the stripping of the resist and the via resistance was measured in response to respective temperatures for plasma stripping process by pointing with the measurement probe 42 after forming the member for the measurement similarly as in example 1 as shown in FIG. 5, and then the production yield of the via was investigated. Results are shown in FIG. 7.

Figure 7:
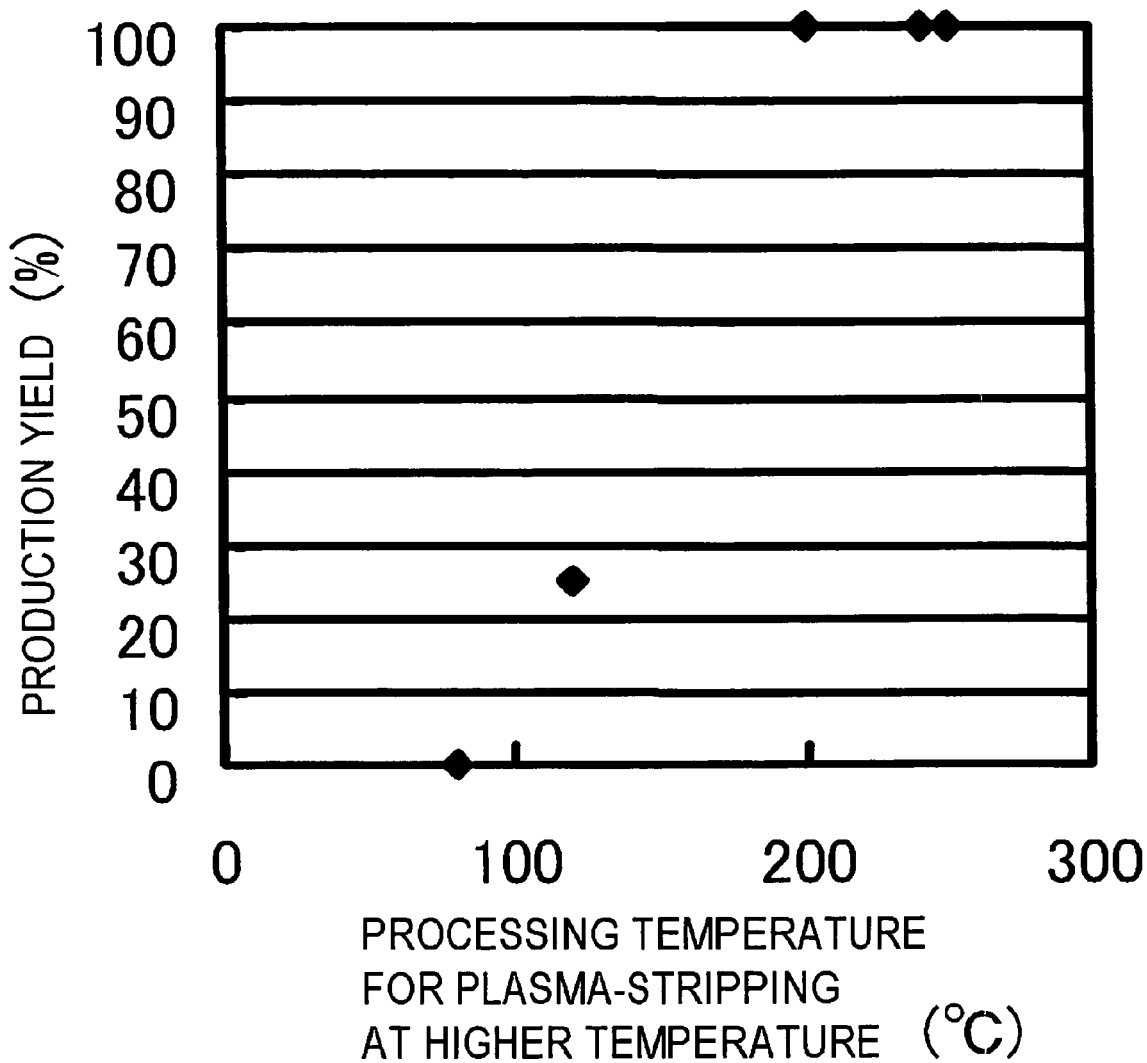
FIG. 7 is a graph, showing an advantageous effect of temperature of a high temperature-plasma stripping process.

As can be seen form FIG. 7, it can be understood that an improved production yield was obtained by conducting the high temperature-plasma stripping process at equal to or higher than 200 degree C. for stripping the resist. In addition, it was confirmed that the advantageous effect of reducing the via resistance was achieved by conducting the high temperature-plasma stripping process for 30 seconds or longer, though a graph is not presented here. On the contrary, it was also found that shorter processing time of less than 30 seconds provided an increase of the via resistance. Further, it was also confirmed by the present inventors that further reduction in the resistance of the device can be achieved by conducting the plasma stripping process at high-temperature for stripping the resist.

Example 6

According to second embodiment of the present invention, subsequent to the etching for forming the via hole, a plasma-processing was conducted with a parallel-plate plasma etcher that is identical to one employed in the previous process at a room temperature of equal to or lower than 30 degree C. by applying an electric power of 1,000 W to the upper electrode and applying an electric power of 100 W to the lower electrode and under conditions that is equivalent to the condition for conducting milder sputter etching than the previously conducted dry etching for forming the via hole. Thereafter, an electric power of 600 to 1,400 W was applied at a temperature of 200 degree C. or higher in a presence of oxygen gas to conduct a high temperature-plasma stripping process, thereby stripping the resist. Thereafter, an ultra-violet processing was additionally carried out to further conduct an organic solvent-stripping process.

Then, after 72 hours was passed, a sputter process of titanium nitride was conducted, and as shown in FIG. 5, a formation of the via plug 44 composed of tungsten or the like was conducted, and an interconnect pad was further formed on the upper surface thereof to form an interconnect pattern test elementary group (TEG) for measuring the via resistance. Here, electric charge accumulated in the interconnect is schematically expressed as an electric charge accumulation area 40 under the interconnect 16 in FIG. 5. Such interconnect pattern TEG was employed to measure via resistances by pointing the interconnect pad with a measurement probe 42 of a prober (resistance measurement apparatus) at one hundred points on a wafer surface. Plots of the results of the via resistance obtained by applying a certain voltage is shown in FIG. 8 as presented by cumulative frequency.

Example 7

Figure 8:
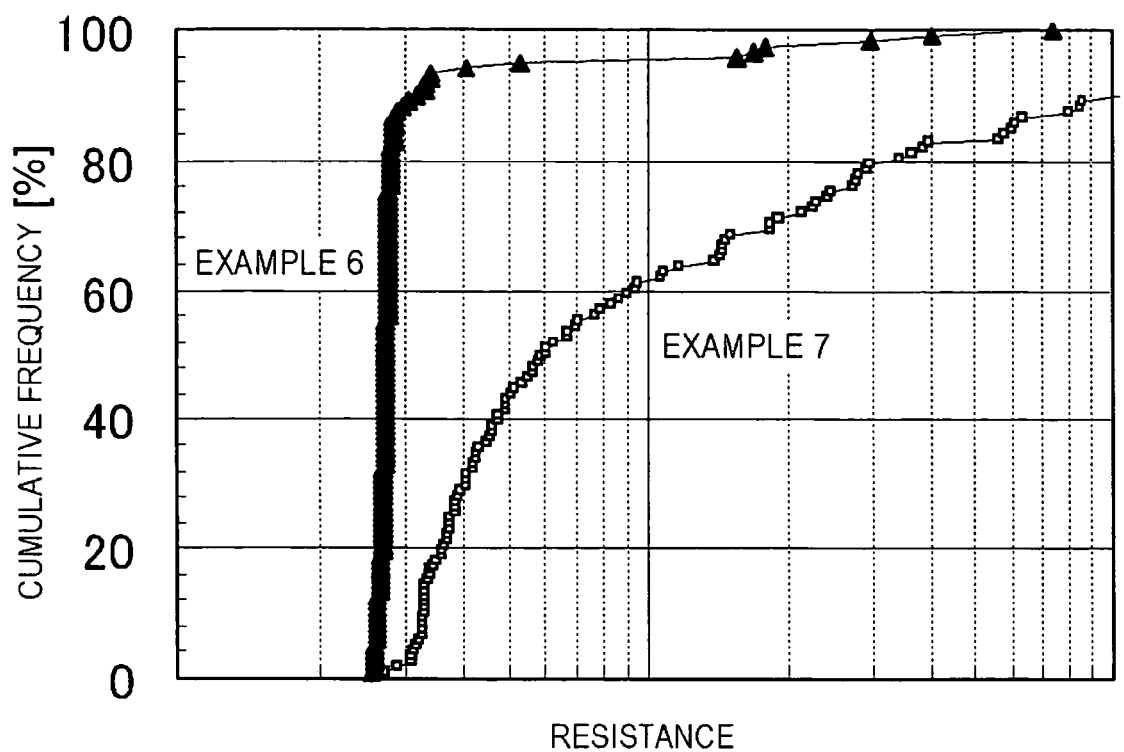
FIG. 8 is a graph, showing an advantageous effect of an ultra-violet processing after the high temperature plasma stripping process.

Similar procedure as employed in example 6 was conducted, except that the ultra-violet processing was not conducted after the high temperature-plasma stripping process, and the device was left for a time that is equivalent to the duration time taken for the ultra-violet processing in example 6, and then an organic solvent-stripping process was carried out, and the via resistances were measured by pointing the interconnect pads of respective interconnect pattern TEG with the measurement probe similarly as in example 6 as shown in FIG. 5, in which the pointing measurements were carried out at one hundred points over a wafer surface, and the plots of the results of the via resistance obtained by applying a certain voltage is shown in FIG. 8 as presented by cumulative frequency.

According to the FIG. 8, uneven distribution of the resistances were found in the wafer surface according to the results of example 7, suggesting that portions of higher resistance were included. On the other hand, in example 6, a peak frequency of points is presented at a certain lower value of resistance, suggesting that substantially no deviation is included in the via resistance distribution. These results teaches that the implementation of the ultra-violet processing for the exposed portion 32 of the TiN film 18 after the high temperature-plasma stripping process promotes the advantageous effect of reducing the via resistance.

What is claimed is:

1. A method for manufacturing a semiconductor device, comprising:

forming a TiN film over a semiconductor substrate;

forming an interlayer insulating film on a surface of said TiN film;

forming a resist film on a surface of said interlayer insulating film;

etching said interlayer insulating film using said resist film as a mask to form an opening, thereby partially exposing said TiN film and forming a layer containing C, F and Ti on the exposed portion of the TiN film;

after said etching said interlayer insulating film using said resist film as a mask to form an opening, plasma-processing the exposed portion of said TiN film to remove said layer; and after said plasma-processing the exposed portion of said TiN film to remove said layer, stripping said resist film by plasma stripping, wherein said plasma-processing is conducted at a temperature wherein oxygen is not in an activated state throughout processing, and in a gas that is free of organic fluoride, and wherein said layer is removed by applying electric power to a lower electrode of less than 500 W.

2. The method for manufacturing the semiconductor device according to claim 1, wherein said etching the semiconductor substrate and said plasma-processing the exposed portion of said TiN film are sequentially carried out without opening the system to an atmospheric air.

3. The method for manufacturing the semiconductor device according to claim 1, wherein said plasma-processing the exposed portion of said TiN film is conducted under a condition that does not involve stripping the resist.

4. The method for manufacturing the semiconductor device according to claim 1, wherein said method further comprises processing the exposed portion of the TiN film with an ultra-violet ray after completing said stripping said resist film via the plasma stripping.

5. The method for manufacturing the semiconductor device according to claim 4, wherein said method further comprises conducting a stripping process with an organic solvent, after completing said processing the exposed portion of the TiN film with the ultra-violet ray.

6. The method for manufacturing the semiconductor device according to claim 1, wherein said stripping said resist film by the plasma stripping is conducted under a condition of a substrate temperature of equal to or higher than 200 degree C.

7. The method for manufacturing the semiconductor device according to claim 1, wherein said stripping said resist film by the plasma stripping is conducted for equal to or longer than 30 seconds.

8. The method for manufacturing a semiconductor device according to claim 1, wherein said temperature is equal to or lower than 30 degree C.

9. The method for manufacturing a semiconductor device according to claim 1, wherein said plasma-processing is conducted under argon atmosphere.

10. The method for manufacturing a semiconductor device according to claim 1, further comprising the step of forming another TiN film after said stripping said resist film by plasma stripping.

11. A method for manufacturing a semiconductor device, comprising:

forming a TiN film over a semiconductor substrate;

forming an interlayer insulating film on a surface of said TiN film;

forming a resist film on a surface of said interlayer insulating film;

etching said interlayer insulating film using said resist film as a mask to form an opening, thereby partially exposing said TiN film leaving a layer containing C, F and Ti formed on the exposed portion of the TiN film;

plasma-processing the exposed portion of said TiN film to remove said layer; and after said plasma-processing the exposed portion of said TiN film to remove said layer, stripping said resist film by plasma stripping, wherein said plasma-processing is conducted at 30 degrees C. or less in a gas that is free of organic fluoride, wherein said stripping resist film by plasma stripping is conducted under a condition of a temperature equal to or greater than 200 degrees C. for 30 seconds or longer, and wherein said layer is removed by applying electric power to a lower electrode of less than 500 W.

12. A method for manufacturing a semiconductor device, comprising:

forming a TiN film over the semiconductor substrate;

forming an interlayer insulating film on a surface of said TiN film;

forming a resist film on a surface of said interlayer insulating film;

etching said interlayer insulating film using said resist film as a mask to form an opening, thereby partially exposing said TiN film and forming a layer containing C, F and Ti on the exposed portion of the TiN film;

after said etching said interlayer insulating film using said resist film as a mask to form an opening, plasma-processing the exposed portion of said TiN film to remove said layer under a condition that does not strip the resist; and after said plasma-processing the exposed portion of said TiN film to remove said layer, stripping said resist film by a high temperature plasma stripping, wherein said plasma-processing is conducted at a temperature wherein oxygen is not in an activated state throughout processing, and in a gas that is free of organic fluoride, and wherein said layer is removed by applying electric power to a lower electrode of less 500 W.

13. The method for manufacturing the semiconductor device according to claim 12, wherein said etching the semiconductor substrate and said plasma-processing the exposed portion of said TiN film are sequentially carried out without opening the system to an atmospheric air.

14. The method for manufacturing the semiconductor device according to claim 12, wherein said method further comprises processing the exposed portion of the TiN film with an ultra-violet ray after completing said stripping said resist film via the plasma stripping.

15. The method for manufacturing the semiconductor device according to claim 12, wherein said stripping said resist film by the plasma stripping is conducted under a condition of a substrate temperature of equal to or higher than 200 degree C.

16. The method for manufacturing the semiconductor device according to claim 12, wherein said stripping said resist film by the plasma stripping is conducted for equal to or longer than 30 seconds.

* * * * *